United States Patent
Xia et al.

(10) Patent No.: US 6,699,784 B2
(45) Date of Patent: Mar. 2, 2004

(54) METHOD FOR DEPOSITING A LOW K DIELECTRIC FILM (K>3.5) FOR HARD MASK APPLICATION

(75) Inventors: Li-Qun Xia, Santa Clara, CA (US); Ping Xu, Fremont, CA (US); Louis Yang, San Francisco, CA (US); Tzu-Fang Huang, San Jose, CA (US); Wen H. Zhu, Sunnyvale, CA (US)

(73) Assignee: Applied Materials Inc., Santa Clara, CA (US)

( * ) Notice: Subject to any disclaimer, the term of this patent is extended or adjusted under 35 U.S.C. 154(b) by 39 days.

(21) Appl. No.: 10/096,503

(22) Filed: Mar. 12, 2002

(65) Prior Publication Data

US 2003/0113995 A1 Jun. 19, 2003

Related U.S. Application Data

(60) Provisional application No. 60/340,615, filed on Dec. 14, 2001.

(51) Int. Cl.$^7$ .............................................. H01L 21/31
(52) U.S. Cl. ..................... 438/637; 438/778; 438/638; 257/632; 257/638
(58) Field of Search ................. 438/637, 778, 438/638, FOR 395; 257/632, 638

(56) References Cited

U.S. PATENT DOCUMENTS

| | | | |
|---|---|---|---|
| 4,894,352 A | 1/1990 | Lane et al. ................. 437/238 |
| 5,238,866 A | 8/1993 | Bolz et al. ................. 437/100 |
| 5,314,724 A | 5/1994 | Tsukune et al. ............ 427/489 |
| 5,362,526 A | 11/1994 | Wang et al. ............... 427/573 |
| 5,423,941 A | 6/1995 | Komura et al. .......... 156/643.1 |
| 5,465,680 A | 11/1995 | Loboda ....................... 117/84 |
| 5,525,550 A | 6/1996 | Kato ........................... 437/238 |
| 5,593,741 A | 1/1997 | Ikeda .......................... 427/579 |
| 5,618,619 A | 4/1997 | Petrmichl et al. ........... 428/334 |
| 5,679,413 A | 10/1997 | Petrmichl et al. ........... 427/536 |
| 5,711,987 A | 1/1998 | Bearinger et al. ............. 427/7 |
| 5,741,626 A | 4/1998 | Jain et al. ................... 430/314 |
| 5,780,163 A | 7/1998 | Camilletti et al. .......... 428/446 |
| 5,818,071 A | 10/1998 | Loboda et al. ................ 257/77 |
| 5,989,998 A | 11/1999 | Sugahara et al. ........... 438/623 |
| 6,072,227 A | 6/2000 | Yau et al. .................... 257/642 |
| 6,114,259 A | 9/2000 | Sukharev et al. ........... 438/789 |
| 6,159,871 A | 12/2000 | Loboda et al. .............. 438/786 |
| 6,242,339 B1 | 6/2001 | Aoi ............................ 438/623 |
| 6,303,523 B2 | 10/2001 | Cheung et al. ............. 438/780 |
| 6,340,435 B1 | 1/2002 | Bjorkman et al. ............ 216/72 |
| 6,344,693 B1 | 2/2002 | Kawahara et al. .......... 257/759 |
| 6,348,725 B2 | 2/2002 | Cheung et al. ............. 257/642 |
| 6,410,463 B1 | 6/2002 | Matsuki ...................... 438/790 |
| 6,413,583 B1 | 7/2002 | Moghadam et al. ... 427/249.15 |
| 6,429,121 B1 | 8/2002 | Hopper et al. .............. 438/636 |
| 6,436,824 B1 | 8/2002 | Chooi et al. ................ 438/687 |
| 6,489,238 B1 | 12/2002 | Tsui ............................ 438/676 |
| 6,495,448 B1 | 12/2002 | Lee ............................. 438/624 |
| 6,500,773 B1 | 12/2002 | Gaillard et al. ............. 438/790 |
| 6,511,903 B1 | 1/2003 | Yau et al. .................... 438/623 |
| 6,511,909 B1 | 1/2003 | Yau et al. .................... 438/638 |
| 6,528,426 B1 | 3/2003 | Olsen et al. ................ 438/689 |
| 6,537,929 B1 | 3/2003 | Cheung et al. ............. 438/790 |
| 6,541,282 B1 | 4/2003 | Cheung et al. ................. 438/5 |
| 6,555,476 B1 | 4/2003 | Olsen et al. ................ 438/692 |
| 6,562,690 B1 | 5/2003 | Cheung et al. ............. 438/400 |
| 6,573,196 B1 | 6/2003 | Gaillard et al. ............. 438/789 |
| 6,593,247 B1 | 7/2003 | Huang et al. ............... 438/758 |
| 2002/0000670 A1 | 1/2002 | Yau et al. .................... 257/759 |
| 2002/0045361 A1 | 4/2002 | Cheung et al. ............. 438/790 |
| 2002/0111042 A1 | 8/2002 | Yau et al. .................... 438/789 |
| 2002/0160626 A1 | 10/2002 | Matsuki et al. ............. 438/780 |
| 2002/0173172 A1 | 11/2002 | Loboda et al. .............. 438/786 |
| 2002/0187629 A1 | 12/2002 | Huang et al. ............... 438/624 |
| 2003/0008511 A1 | 1/2003 | Tsai et al. ................... 438/694 |
| 2003/0085408 A1 | 5/2003 | Yang et al. ................... 257/77 |

FOREIGN PATENT DOCUMENTS

| | | | |
|---|---|---|---|
| DE | 199 04 311 | 8/1999 | .......... C23C/16/44 |
| EP | 0 613 178 | 8/1994 | .......... H01L/21/90 |
| EP | 0 725 440 | 8/1996 | ......... H01L/23/532 |
| WO | 99/41423 | 8/1999 | |

Primary Examiner—George Fourson
Assistant Examiner—Joannie A Garcia
(74) Attorney, Agent, or Firm—Moser, Patterson & Sheridan

(57) ABSTRACT

A method for depositing a silicon oxycarbide hard mask on a low k dielectric layer is provided. Substrates containing a silicon oxycarbide hard mask on a low k dielectric layer are also disclosed. The silicon oxycarbide hard mask may be formed by a processing gas comprising a siloxane.

20 Claims, 3 Drawing Sheets

METHOD FOR DEPOSITING A LOW K DIELECTRIC FILM (K>3.5) FOR HARD MASK APPLICATION

CROSS-REFERENCE TO RELATED APPLICATIONS

This application claims benefit of U.S. provisional patent application serial No. 60/340,615, filed Dec. 14, 2001, entitled "A Method for Depositing Dielectric Materials in Damascene Applications," which is herein incorporated by reference.

BACKGROUND OF THE INVENTION

1. Field of the Invention

The present invention generally relates to the fabrication of integrated circuits. More particularly, the invention relates to a process for depositing a hard mask on a dielectric layer and structures which include the hard mask and the dielectric layer.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 $\mu$m and even 0.18 $\mu$m feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constant k< about 3.5) to also reduce the capacitive coupling between adjacent metal lines. One such low k material is spin-on glass, such as un-doped silicon glass (USG) or fluorine-doped silicon glass (FSG), which can be deposited as a gap fill layer in a semiconductor manufacturing process. Another such low k material is silicon carbide which can be used as a dielectric layer in fabricating damascene features.

Conductive materials having a low resistivity include copper and its alloys, which have become the materials of choice for sub-quarter-micron interconnect technology because copper has a lower resistivity than aluminum, (1.7 $\mu\Omega$-cm compared to 3.1 $\mu\Omega$-cm for aluminum), a higher current and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and pattern precisely. Etching copper using traditional deposition/etch processes for forming interconnects has been less than satisfactory. Therefore, new methods of manufacturing interconnects having copper containing materials and low k dielectric materials are being developed.

Methods for forming vertical and horizontal interconnects include damascene and dual damascene methods. In the damascene method, one or more dielectric materials, such as low k dielectric materials, are deposited and pattern etched to form the vertical interconnects, e.g. vias, or horizontal interconnects, e.g., lines. Conductive materials, such as copper containing materials, and optionally, other materials, such as barrier layer materials used to prevent diffusion of copper containing materials into the surrounding low k dielectric, are then inlaid into the vertical interconnects or the horizontal interconnects. Any excess copper containing materials and excess barrier layer material external to the etched pattern, such as on the field of the substrate, is then removed. In the dual damascene method, both the vertical interconnects and the horizontal interconnects are formed before conductive materials are inlaid.

One method used to form horizontal interconnects includes the use of a hard mask. A hard mask is deposited on a substrate layer, such as a dielectric layer, and patterned to define the openings of horizontal interconnects. Unlike soft masks, hard masks remain as part of the structure after the underlying dielectric layer is etched to form the cavities which are horizontal interconnects. Thus, hard masks should be resistant to the etchant or the process used to etch the underlying dielectric layer. Preferably, hard masks have a low dielectric constant, as they remain in a structure and contribute to the structure's overall dielectric constant. Furthermore, hard masks are also preferably thermally stable and physically strong, so that they will not be damaged during substrate processing steps, such as annealing at high temperatures and chemical mechanical polishing.

There remains a need for an improved process for depositing hard masks which are strong, have a low dielectric constant, and are resistant to etchants used to etch the dielectric layer upon which they are deposited.

SUMMARY OF THE INVENTION

Aspects of the invention generally provide a method for depositing a low k silicon oxycarbide hard mask over a low k dielectric layer. In one embodiment, the invention provides a method of forming an interconnect structure on a substrate surface, comprising depositing a low k dielectric layer comprising a polyimide, a polytetrafluoroethylene, a parylene, a polysilsesquioxane, a fluorinated poly(aryl ether), a fluorinated amorphous carbon, a silicon oxycarbide having a hardness of 1 giga Pascal (gPa) or less, or a silicon carbide, depositing a silicon oxycarbide hard mask having a hardness of greater than 1 gPa over the low k dielectric layer, patterning the hard mask with a horizontal interconnect pattern into the low k dielectric layer to form cavities corresponding to the horizontal interconnect pattern. In another embodiment, the invention provides a method of forming an interconnect structure on a substrate surface, comprising depositing a dielectric layer, depositing an etch stop over the dielectric layer, depositing a low k dielectric layer comprising a polyimide, a polytetrafluroethylene, a parylene, a polysilsesquioxane, a fluorinated poly(aryl ether), a fluorinated amorphous carbon, a silicon oxycarbide having a hardness of 1 giga Pascal (gPa) or less, or a silicon carbide, over the etch stop, and depositing a silicon oxycarbide hard mask having a hardness of greater than 1 gPa and formed by a processing gas comprising a siloxane.

In other aspects of the invention, substrates comprising a low k dielectric layer and a silicon oxycarbide hard mask are provided. In one or more embodiments, a substrate comprises a low k dielectric layer, comprising a material selected from the group consisting of polyimides, polytetrafluroethylene, parylenes, polysilsesquioxanes, fluorinated poly(aryl ethers), fluorinated amorphous carbon, silicon oxycarbides having a hardness of 1 gPa or less, and silicon carbides, and a silicon oxycarbide hard mask having a hardness of greater than 1 gPa and having a porosity of less than about 2%. In one embodiment, a substrate comprises a dielectric layer, an etch stop, a low k dielectric layer comprising a polyimide, a polytetrafluroethylene, a parylene, a polysilsesquioxane, a fluorinated poly(aryl ether), a fluorinated amorphous carbon, a silicon oxycarbide having a hardness of 1 gPa or less, or a silicon carbide, and a silicon oxycarbide hard mask having a hardness of greater than 1 gPa and formed by a processing gas comprising a siloxane. In another embodiment, a substrate comprises a dielectric layer patterned with a horizontal interconnect, an etch stop over the dielectric layer that is not part of the horizontal interconnect, a low k dielectric layer comprising a polyimide, a polytetrafluroethylene, a parylene, a polysilsesquioxane, a fluorinated poly(aryl ether), a fluorinated amorphous carbon, a silicon oxycarbide having a hardness of 1 gPa or less, or a silicon carbide, over the etch stop and patterned with a horizontal interconnect, and a silicon oxycarbide hard mask having a hardness of greater than 1 gPa and formed by a processing gas comprising a siloxane, over the portion of the low k dielectric layer that is not part of the horizontal interconnect.

BRIEF DESCRIPTION OF THE DRAWINGS

So that the manner in which the aspects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1A:
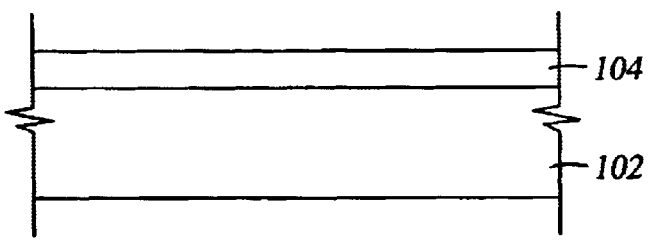
FIGS. 1A–1E are cross sectional views showing one embodiment of an interconnect deposition sequence.

Aspects of the invention described herein refer to a method for depositing a low k silicon oxycarbide hard mask (k<3.5) on a low k dielectric layer (k<3.5) of a substrate. Aspects of the invention described herein also refer to substrates including a silicon oxycarbide hard mask on a low k dielectric layer.

The low k dielectric layer comprises material selected from the group consisting of polyimides, polytetrafluoroethylenes, parylenes, polysilsesquioxanes, fluorinated poly(aryl ethers), fluorinated amorphous carbon, silicon oxycarbides, and silicon carbides. The low k dielectric layer may be deposited on a substrate by reacting a processing gas in a plasma to form a dielectric layer having a dielectric constant less than about 4. A dopant-containing gas may also be present during the reaction. The processing gas may also include nitrogen ($N_2$) or an inert gas, such as argon (Ar) or helium (He), or combinations thereof.

In a low k dielectric layer which comprises silicon oxycarbides, the silicon oxycarbides may comprise various silicon, carbon, oxygen, and hydrogen containing materials. For example, the silicon oxycarbides may comprise silicon oxycarbides, such as Black Diamond™ film, available from Applied Materials, Inc., Santa Clara, Calif. A method for depositing silicon oxycarbides is described in U.S. Pat. No. 6,287,990 B1, entitled, "CVD Plasma Assisted Low Dielectric Constant Films," assigned to Applied Materials, Inc., the assignee of the present invention, and incorporated by reference herein.

Preferably, the porosity of the dielectric layer comprising a silicon oxycarbide is greater than about 10% to achieve a dielectric constant (k) of below about 2.8. In an embodiment using a low k dielectric layer comprising a silicon oxycarbide, the hardness of the dielectric layer is 1 gPa or less. The hardness of the dielectric layer is limited by the porosity that contributes to the low k of the layer. Silicon oxycarbide low k dielectric layers with the preferred hardnesses and/or porosities may be formed by controlling the amount of carbon in the silicon oxycarbide low k dielectric layers. For example, the following processing conditions may be used in a deposition chamber to form a low k dielectric layer: a pressure of about 5.75 Torr, a temperature of about 400° C., an RF power of about 800 watts, a heater spacing of about 50 mils, about 500 milligrams per minute (mgm) of octamethylcyclotetrasiloxane, about 600 standard cubic centimeters per minute (sccm) of trimethylsilane, about 1000 sccm of helium, about 1000 scmm of oxygen, and about 2000 sccm of ethylene. A dielectric layer created by such a process has hardness of about 0.8 gPa and a porosity of about 18%. The k of the dielectric layer is about 2.5.

The silicon oxycarbide hardmask which is deposited on the low k dielectric layer described above is formed by reacting a processing gas comprising a siloxane in a plasma. The silicon oxycarbide hard mask comprises silicon, oxygen, carbon, and hydrogen, and has a dielectric constant of less than about 3.5, preferably less than about 3. A low dielectric constant is a desirable feature for a hard mask because at least part of a hard mask typically remains in the substrate in which it is used.

The silicon oxycarbide hard masks described herein are particularly useful for patterning horizontal interconnect cavities into soft dielectric layers, i.e., having a hardness of less than about 0.5 giga Pascal, such as SILK® dielectric coatings available from Dow Chemical Company. Furthermore, it is contemplated that the use of the combination of these hard masks with the low k dielectric layers described above will result in precise patterning of the low k dielectric layers because of the different etching properties of the hard masks and the low k dielectric layers. For example, if CF chemistry is used as an etchant on a substrate including a silicon oxycarbide hard mask and a SILK® dielectric layer, the silicon carbide layer will be etched and the silicon oxycarbide hard mask will not be etched.

The silicon oxycarbide hard mask has a hardness of greater than 1 gPa, preferably greater than about 1.5 gPa. Preferably, the silicon oxycarbide hard mask has a porosity of less than about 2% to prevent oxidative diffusion and moisture diffusion into the porous underlying dielectric layer. The hardness of the silicon oxycarbide hard mask allows the hard mask to serve as a polishing stop during chemical mechanical polishing (CMP). CMP does not remove the hard mask, and thus, the hard mask protects underlying layers from overpolishing.

Preferably, the silicon oxycarbide hard mask is formed by reacting a processing gas comprising a linear siloxane in a plasma. It is believed that the use of linear siloxanes rather than other types of siloxanes will result in the formation of a stronger hard mask. A strong hard mask is not as easily damaged during substrate processing steps such as chemical mechanical polishing. It is also believed that linear siloxanes are more stable and less likely to change structure. The ring structures of cyclic siloxanes, such as tetramethylcyclotetrasiloxane (TMCTS) can open, and the siloxanes may then self-polymerize. Examples of linear siloxanes that may be used include 1,1,3,3-tetramethyldisiloxane (TMDSO) and hexamethyldisiloxane. The ratio of silicon atoms to oxygen atoms in the processing gas can be selected by the choice of siloxane and used to tune the properties of the film by varying the relative amount of the atoms in the deposited material.

Preferably, the silicon oxycarbide hard mask is formed by reacting a processing gas comprising a linear siloxane in a plasma that does not contain oxygen gas. The absence of oxygen in the plasma prevents oxidative damage to the underlying dielectric layer, which is particularly important when a carbon containing dielectric layer, such as a SILK® dielectric coating, is used.

A preferred silicon oxycarbide hard mask is deposited in one embodiment by supplying a linear siloxane to a plasma processing chamber at a flow rate between about 10 and about 1000 standard cubic centimeters per minute (sccm). An inert gas, such as helium, argon, or combinations thereof, is also supplied to the chamber at a flow rate between about 50 sccm and about 5000 sccm. The chamber pressure is maintained between about 100 milliTorr and about 15 Torr. The substrate surface temperature is maintained between about 100° C. and about 450° C. during the deposition process. Alternatively, a doped silicon oxycarbide layer can be deposited by introducing oxygen and/or a nitrogen source, or other dopant, into the processing chamber at a flow rate between about 50 sccm and about 10,000 sccm.

The linear siloxane, inert gas, and optional dopant, are introduced to the processing chamber via a gas distribution plate spaced between about 200 millimeters (mm) and about 600 millimeters from the substrate on which the silicon carbide layer is being deposited upon. Power from a single 13.56 MHz RF power source is supplied to the chamber 10 to form the plasma at a power density between about 0.3 watts/cm$^2$ and about 3.2 watts/cm$^2$, or a power level between about 100 watts and about 1000 watts for a 200 mm substrate. A power density between about 0.9 watts/cm$^2$ and about 2.3 watts/cm$^2$, or a power level between about 300 watts and about 700 watts for a 200 mm substrate, is preferably supplied to the processing chamber to generate the plasma. Additionally, the ratio of the silicon source to the dopant in the gas mixture should have a range between about 1:1 and about 1:100. The above process parameters provide a deposition rate for the silicon oxycarbide layer in a range between about 100 Å/min and about 3000 Å/min when implemented on a 200 mm (millimeter) substrate in a deposition chamber available from Applied Materials, Inc., located in Santa Clara, Calif.

An example of a CVD reactor that may be used with the processes herein is the Producer™ system, which is described in U.S. Pat. No. 5,855,681, entitled, "Ultra High Throughput Wafer Vacuum Processing System," assigned to Applied Materials, Inc., the assignee of the present invention, and incorporated by reference herein.

Following deposition, the deposited silicon oxycarbide may be annealed at a temperature between about 100° C. and about 400° C. for between about 1 minute and about 60 minutes, preferably at about 30 minutes, to reduce the moisture content and increase the solidity and hardness of the silicon oxycarbide, if desired. Inert gases, such as argon and helium, reducing gases, such as hydrogen, a combination of water and inert gas, or a combination of water and reducing gas may be added to the annealing atmosphere.

The deposited silicon oxycarbide layer may be plasma treated to modify the surface bonding structure or the exposed surface of the silicon oxycarbide layer may be otherwise conditioned prior to subsequent deposition of materials thereon. The plasma treatment may be performed in the same chamber used to deposit the silicon oxycarbide.

The plasma treatment generally includes providing an inert gas including helium, argon, neon, xenon, krypton, or combinations thereof, of which helium is preferred, and/or a reducing gas including hydrogen, ammonia, and combinations thereof, to a processing chamber. The inert gas or reducing gas is introduced into the processing chamber at a flow rate between about 500 sccm and about 3000 sccm, and generating a plasma in the processing chamber. The plasma may be generated using a power density ranging between about 0.03 watts/cm$^2$ and about 3.2 watts/cm$^2$, which is a RF power level of between about 10 watts and about 1000 watts for a 200 mm substrate. Preferably, the power level is about 100 watts for a silicon carbide material on a 200 mm substrate. The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle.

The processing chamber is preferably maintained at a chamber pressure of between about 2 Torr and about 12 Torr, for example about 2.5 Torr. The substrate is preferably maintained at a temperature between about 250° C. and about 450° C. during the plasma treatment. A substrate temperature of about the same temperature of the silicon oxycarbide deposition process, for example about 290° C., may be used during the plasma treatment. The plasma treatment may be performed between about 10 seconds and about 100 seconds, with a plasma treatment between about 40 seconds and about 60 seconds preferably used. The processing gas may be introduced into the chamber by a gas distributor, the gas distributor may be positioned between about 200 mils and about 800 mils from the substrate surface. The showerhead may be positioned between about 300 mils and about 400 mils during the plasma treatment.

However, it should be noted that the respective parameters may be modified to perform the plasma processes in various chambers and for different substrate sizes, such as 300 mm substrates. An example of a plasma treatment for a silicon and carbon containing film is further disclosed in U.S. patent application Ser. No. 09/336,525, entitled, "Plasma Treatment to Enhance Adhesion and to Minimize Oxidation of Carbon-Containing Layers," filed on Jun. 18, 1999, which is incorporated herein by reference to the extent not inconsistent with the disclosure and claimed aspects of the invention described herein.

Deposition of a Hard Mask for an Interconnect Structure

An example of an interconnect structure that is formed using the silicon oxycarbide material described herein as a hard mask is shown in FIG. 1A. A silicon oxycarbide hardmask layer 104 having a hardness of greater than 1 gPa is generally deposited using a siloxane according to the processes described herein on a low k dielectric layer 102 comprising material selected from the group consisting of polyimides, polytetrafluoroethylene, parylenes, polysilsesquioxanes, fluorinated poly(aryl ethers), fluorinated amorphous carbon, silicon oxycarbides having a hardness of 1 giga Pascal (gPa) or less, and silicon carbides.

Figure 1B:
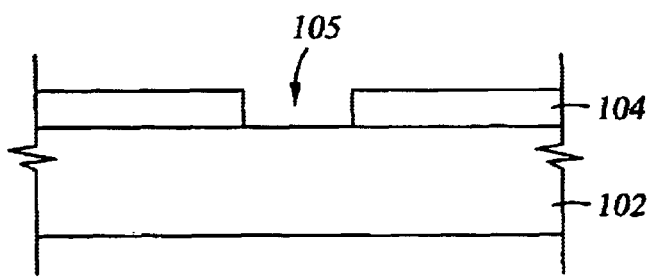
Figure 1C:
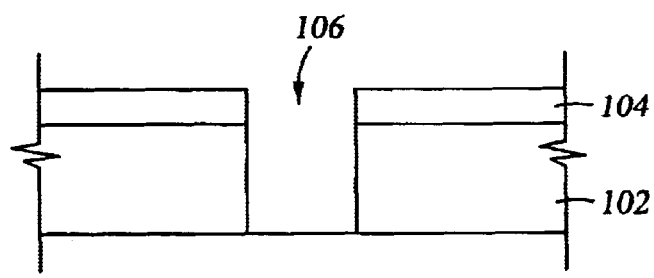
Figure 1D:
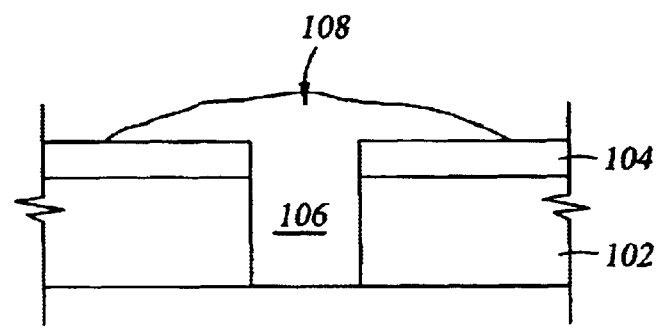

FIG. 1B shows the structure of FIG. 1A after the silicon oxycarbide layer hardmask 104 is patterned with a horizontal interconnect pattern. The silicon oxycarbide layer hardmask 104 may be patterned by the use of a photoresist material (not shown) deposited on the silicon oxycarbide layer hardmask 104 and patterned preferably using conventional photolithography processes to define a horizontal interconnect opening 105. The photoresist material comprises a material conventionally known in the art, preferably a high activation energy photoresist, such as UV-5, commercially available from Shipley Company Inc., of Marlborough, Mass. The low k dielectric layer 102 is then etched using reactive ion etching or other anisotropic etching techniques to define the horizontal interconnect 106, as shown in FIG. 1C. Any photoresist or other material used to pattern the silicon oxycarbide hardmask 104 is removed using an oxygen strip or other suitable process.

In one embodiment, the horizontal interconnect 106 is then filled with a conductive material 108 such as copper, aluminum, tungsten, or combinations thereof. Preferably, the conductive material 108 is copper. In one preferred embodiment, a barrier layer (not shown) is deposited on the substrate before the horizontal interconnect 106 is filled with a conductive material 108. A barrier layer helps prevent the diffusion of materials, such as copper into the silicon oxycarbide hard mask 104 and the low k dielectric layer 102.

Figure 1E:
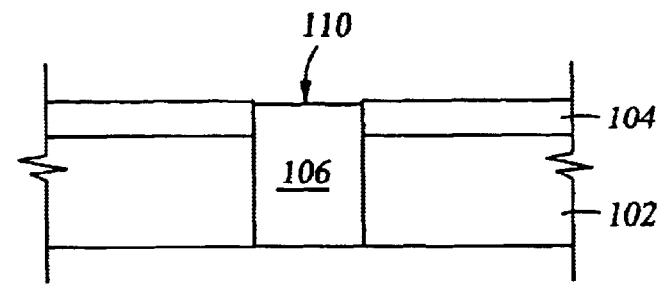

The conductive metal 108 is deposited by either chemical vapor deposition, physical vapor deposition, electroplating, or combinations thereof to form the conductive structure, such as a metal wiring, in the horizontal interconnect 106. Once the horizontal interconnect 106 has been filled with metal, the surface of the structure is planarized using chemical mechanical polishing to yield a planar surface 110, as shown in FIG. 1E. As shown in FIG. 1E, the chemical mechanical polishing stops at and does not remove the hard mask 104.

A preferred dual damascene structure fabricated in accordance with the invention including a silicon oxycarbide hard mask deposited by the processes described herein is shown in FIGS. 2A–2H. It is recognized that the resulting structure, shown in FIGS. 2G and 2H, may be made by other processes than the dual damascene process described herein. For example, methods described in U.S. Pat. No. 6,140,226, entitled, "Dual Damascene Processing For Semiconductor Chip Interconnects," which is incorporated by reference to the extent not inconsistent with the disclosure and claimed aspects of the invention described herein, may be used.

Figure 2A:
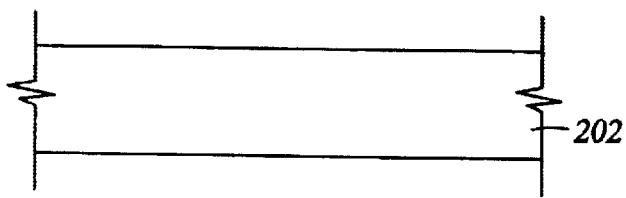
FIGS. 2A–2H are cross sectional view showing one embodiment of dual damascene structure.
Figure 2B:
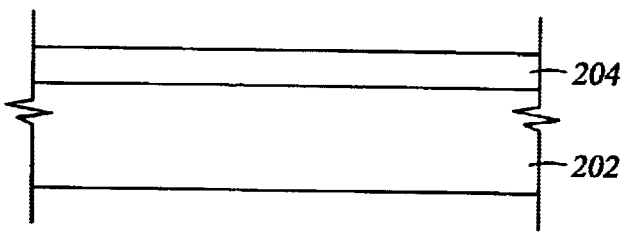
Figure 2C:
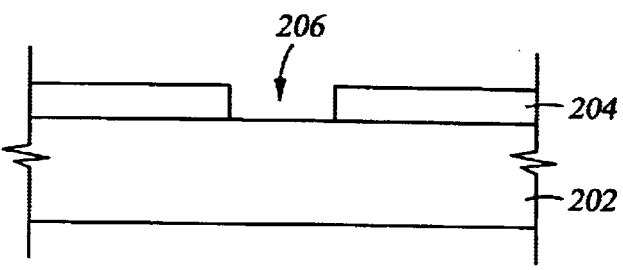
Figure 2D:
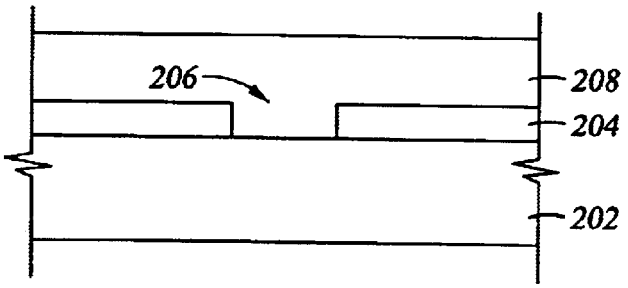
Figure 2E:
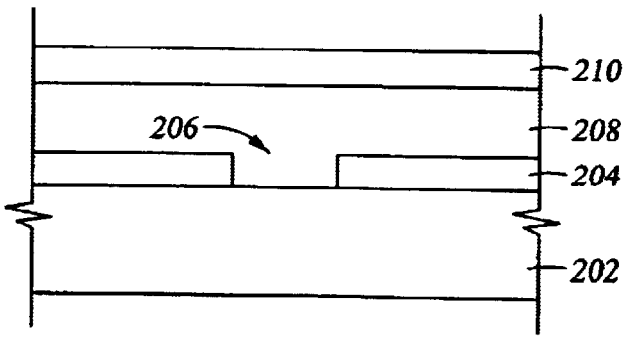
Figure 2F:
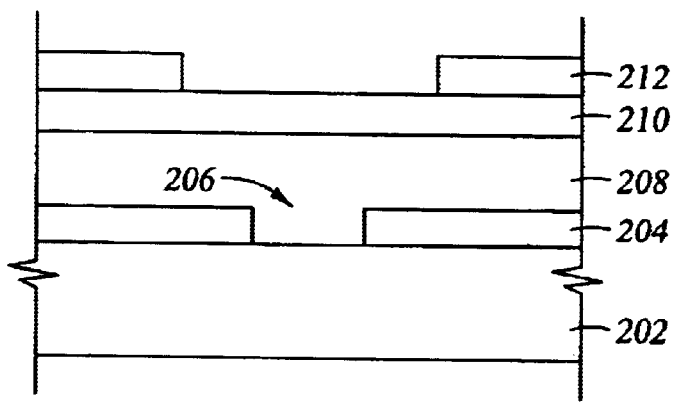
Figure 2G:
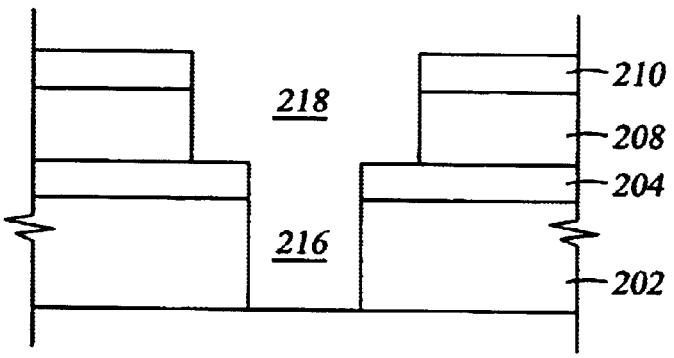

As shown in FIG. 2A, a dielectric layer 202 is deposited. Preferably, the dielectric layer 202 is a low k dielectric layer. An etch stop 204 is deposited on the dielectric layer 202, as shown in FIG. 2B. The etch stop is patterned, as shown in FIG. 2C, such as by using a photoresist and photolithography, to define a vertical interconnect such as via opening 206 and to expose the dielectric layer 202 in the areas where vertical interconnects are to be formed. A low k dielectric layer 208 comprising material selected from the group consisting of polyimides, polytetrafluoroethylene, parylenes, polysilsesquioxanes, fluorinated poly(aryl ethers), fluorinated amorphous carbon, silicon oxycarbides having a hardness of 1 giga Pascal (gPa) or less, and silicon carbides is deposited on the etch stop 204 and the exposed dielectric layer 202, as shown in FIG. 2D. As shown in FIG. 2E, a silicon oxycarbide hard mask 210 having a hardness of greater than 1 gPa is deposited using a siloxane according to the processes described herein. One method of patterning the hard mask is shown in FIGS. 2F and 2G. A layer of photoresist 212 may be deposited on the silicon oxycarbide hard mask and patterned, such as by photolithography, to define a horizontal interconnect opening 214, as shown in FIG. 2F. The silicon oxycarbide hard mask 210, the low k dielectric layer 208, and the dielectric layer 202 are etched to define via 216 and horizontal interconnect 218, as shown in FIG. 2G. Any photoresist 212 or other material on the silicon oxycarbide hard mask 210 is removed using an oxygen strip or other suitable process.

Figure 2H:
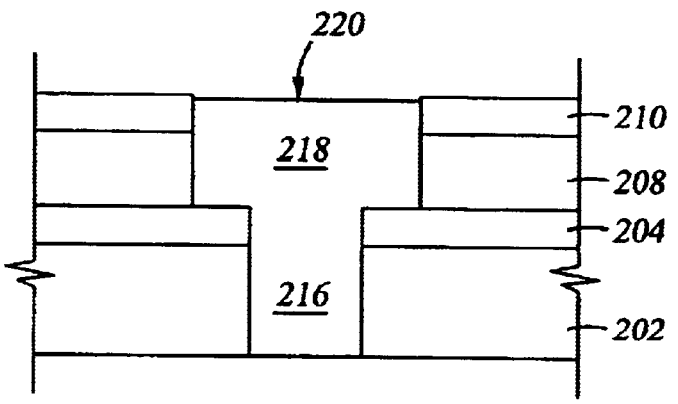

The via 216 and horizontal interconnect 218 may then be filled with a conductive metal 220, such as copper, aluminum, tungsten, or combinations thereof. Optionally, a barrier layer (not shown) may be deposited on the structure before the via 216 and the horizontal interconnect 218 are filled with a conductive metal. Preferably, after the deposition of the metal 220, the surface of the structure is planarized, such as by chemical mechanical polishing, as shown in FIG. 2H.

EXAMPLE

A silicon oxycarbide hard mask was deposited on a low k dielectric layer, such as SILK® dielectric coatings available from Dow Chemical Company or Black Diamond™ films available from Applied Materials, Inc. of Santa Clara, Calif., by introducing 1,1,3,3-tetramethyldisiloxane into a processing chamber at about 400 mg/min, introducing helium at about 250 sccm into the processing chamber, generating a plasma in the processing chamber by applying 700 watts of RF single frequency energy, maintaining the substrate temperature at about 350° C., and maintaining the chamber pressure at about 8 Torr. The heater spacing was about 500 mils from the substrate surface. Under these conditions, the silicon oxycarbide hard mask was deposited at about 1,825 Å/min.

The deposited silicon oxycarbide hard mask was examined, and the measured dielectric constant was about 3.3. The hardness of the silicon oxycarbide hard mask was about 1.8 gPa. The leakage current of the silicon oxycarbide hard mask was about $1.1 \times 10^{-9}$ amps/cm$^2$ at 1 mega volt/cm. The compressive stress of the silicon oxycarbide hard mask was about $2 \times 10^8$ dyne/cm$^2$.

While the foregoing is directed to embodiments of the present invention, other and further embodiments of the invention may be devised without departing from the basic scope thereof, and the scope thereof is determined by the claims that follow.

What is claimed is:

1. A method of forming an interconnect structure on a substrate surface, comprising:
    depositing a low k dielectric layer (k<3.5) comprising a polyimide, a polytetrafluoroethytene, a parylene, a polysilsesquioxane, a fluorinated poly(aryl ether), a fluorinated amorphous carbon, a silicon oxycarbide having a hardness of 1 giga Pascal or less, or a silicon carbide;
    depositing a low k silicon oxycarbide hard mask (k<3.5) having a hardness of greater than 1 giga Pascal over the low k dielectric layer;
    patterning the low k silicon oxycarbide hard mask with a horizontal interconnect pattern; and
    transferring the horizontal interconnect pattern into the low k dielectric layer to form cavities corresponding to the horizontal interconnect pattern.

2. The method of claim 1, further comprising filling the cavities with metal.

3. The method of claim 2, wherein the metal is copper.

4. The method of claim 1, further comprising depositing on the substrate surface a second dielectric layer before depositing the low k dielectric layer.

5. The method of claim 4, further comprising depositing an etch stop on the second dielectric layer before depositing the low k dielectric layer.

6. The method of claim 5, further comprising patterning the etch stop with a via pattern.

7. The method of claim 6, further comprising transferring the via pattern into the second dielectric layer to form via cavities corresponding to the via pattern.

8. The method of claim 1, wherein the low k silicon oxycarbide hard mask is formed by a processing gas comprising a siloxane.

9. The method of claim 8, wherein the siloxane is a linear siloxane.

10. The method of claim 8, wherein the siloxane is 1,1,3,3-tetramethyldisiloxane.

11. The method of claim 1, further comprising depositing a layer of photoresist on the low k silicon oxycarbide hard mask and wherein patterning the low k silicon oxycarbide hard mask comprises patterning the photoresist with a horizontal interconnect pattern and patterning the low k silicon oxycarbide hard mask using the horizontal interconnect patterned layer of photoresist as a mask.

12. The method of claim 1, wherein the low k silicon oxycarbide hard mask has a hardness of greater than about 1.5 giga Pascal.

13. A substrate, comprising:
   a low k dielectric layer (N<3.5), comprising a polyimide, a polytetrafluoroethylene, a parylene, a polysilsesquioxane, a fluorinated poly(aryl ether), a fluorinated amorphous carbon, a silicon oxycarbide having a hardness of 1 giga Pascal or less, or a silicon carbide; and
   a low k silicon oxycarbide hard mask (k<3.5) having a hardness of greater than 1 giga Pascal and having a porosity of less than about 2%.

14. The substrate of claim 13, wherein the low k silicon oxycarbide hard mask is formed by a processing gas comprising a siloxane.

15. The substrate of claim 13, further comprising an etch stop under the low k dielectric layer.

16. The substrate of claim 15, further comprising a second dielectric layer under the etch stop.

17. The substrate of claim 13, wherein the low k silicon oxycarbide hard mask has a hardness of greater than about 1.5 giga Pascal.

18. A substrate comprising a dielectric layer, an etch stop, a low k dielectric layer (k<3.5) comprising a polyimide, a polytetrafluoroethylene, a parylene, a polysilsesquioxane, a fluorinated poly(aryl ether), a fluorinated amorphous carbon, a silicon oxycarbide having a hardness of 1 giga Pascal or less, or a silicon carbide, and a low k silicon oxycarbide hard mask (k<3.5) having a hardness of greater than 1 giga Pascal and formed by a processing gas comprising a siloxane.

19. A substrate comprising a dielectric layer patterned with a horizontal interconnect, an etch stop over the dielectric layer that is not part of the horizontal interconnect, a low k dielectric layer (k<3.5) comprising a polyimide, a polytetrafluoroethylene, a parylene, a polysilsesquioxane, a fluorinated poly(aryl ether), a fluorinated amorphous carbon, a silicon oxycarbide having a hardness of 1 giga Pascal or less, or a silicon carbide, over the etch stop and patterned with a horizontal interconnect, and a low k silicon oxycarbide hard mask (k<3.5) having a hardness of greater than 1 giga Pascal and formed by a processing gas comprising a siloxane, over the low k dielectric layer.

20. A method of forming an interconnect structure on a substrate surface, comprising:
   depositing a dielectric layer;
   depositing an etch stop over the dielectric layer; depositing a low k dielectric layer (k<3.5) comprising a polyimide, a polytetrafluoroethylene, a parylene, a polysilsesquioxane, a fluorinated poly(aryl ether), a fluorinated amorphous carbon, a silicon oxycarbide having a hardness of 1 giga Pascal or less, or a silicon carbide, over the etch stop; and
   depositing a low k silicon oxycarbide hard mask (k<3.5) having a hardness of greater than 1 giga Pascal and formed by a processing gas comprising a siloxane.

* * * * *

UNITED STATES PATENT AND TRADEMARK OFFICE
CERTIFICATE OF CORRECTION

PATENT NO.    : 6,699,784 B2                                          Page 1 of 2
DATED         : March 2, 2004
INVENTOR(S)   : Xia et al.

It is certified that error appears in the above-identified patent and that said Letters Patent is hereby corrected as shown below:

Title page, Item [54] and Column 1, line 2,
Title, please change "(K > 3.5)" to -- (K < 3.5) --.
Item [56], References Cited, U.S. PATENT DOCUMENTS, please insert the following:

| | | | |
|---|---|---|---|
| 4,532,150 A | 7/1985 | Endo et al. | 427/39 |
| 5,298,597 A | 3/1994 | You et al. | 528/336 |
| 5,494,712 A | 2/1996 | Hu et al. | 427/489 |
| 5,638,251 A | 6/1997 | Goel et al. | 361/313 |
| 5,926,740 A | 7/1999 | Forbes et al. | 438/763 |
| 6,051,321 A | 4/2000 | Lee et al. | 428/447 |
| 6,054,379 A | 4/2000 | Yau et al. | 438/623 |
| 6,068,884 A | 5/2000 | Rose et al. | 427/255.5 |
| 6,140,226 A | 10/2000 | Grill et al. | 438/637 |
| 6,147,009 A | 11/2000 | Grill et al. | 438/780 |
| 6,287,990 B1 | 9/2001 | Cheung, et al. | 438/780 |
| 6,316,167 B1 | 11/2001 | Angelopoulos et al. | 430/313 |
| 6,340,628 B1 | 1/2002 | Van Cleemput et al. | 438/586 |
| 6,465,366 B1 | 10/2002 | Nemani et al. | 438/778 |
| 6,627,532 B1 | 9/2003 | Gaillard et al. | 438/623 |
| 2003/0003765 A1 | 1/2003 | Gibson, Jr. et al. | 438/760 |
| 2003/0089988 A1 | 5/2003 | Matsuura | 257/760 |
| 2003/0111730 A1 | 6/2003 | Takeda et al. | 257/758 |

FOREIGN PATENT DOCUMENTS, please insert the following:

| | | | |
|---|---|---|---|
| WO | 00/19498 | 4/2000 | H01L/21/027 |
| EP | 1176226 A1 | 1/2002 | C23C/16/32 |

OTHER PUBLICATIONS, please insert the following:

PCT International Search Report for US02/40034 dated May 19, 2003
Wu, et al. "Advanced Metal Barrier Free Cu Damascene Interconnects with PECVD Silicon Carbide Barriers for 90/65-nm BEOL Technology," 2002 IEEE, IEDM Pages 595-598

Column 4,
Line 18, please change "scmm" to -- sccm --.

UNITED STATES PATENT AND TRADEMARK OFFICE
CERTIFICATE OF CORRECTION

PATENT NO. : 6,699,784 B2
DATED : March 2, 2004
INVENTOR(S) : Xia et al.

It is certified that error appears in the above-identified patent and that said Letters Patent is hereby corrected as shown below:

Column 9,
Line 19, "(N < 3.5)" to -- (K < 3.5) --.

Signed and Sealed this

Ninth Day of November, 2004

JON W. DUDAS
*Director of the United States Patent and Trademark Office*